US012707879B2

(12) United States Patent
Ishida

(10) Patent No.: US 12,707,879 B2
(45) Date of Patent: Aug. 11, 2026

(54) DISPLAY DEVICE MANUFACTURING METHOD INCLUDING FORMING A REPAIR HOLE THAT PENETRATES A SEALING LAYER

(71) Applicant: Magnolia White Corporation, Tokyo (JP)

(72) Inventor: Arichika Ishida, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 397 days.

(21) Appl. No.: 18/485,334

(22) Filed: Oct. 12, 2023

(65) Prior Publication Data

US 2024/0130213 A1 Apr. 18, 2024

(30) Foreign Application Priority Data

Oct. 18, 2022 (JP) ................................ 2022-166932

(51) Int. Cl.
*H10K 71/00* (2023.01)
*H10K 59/12* (2023.01)
*H10K 59/80* (2023.01)

(52) U.S. Cl.
CPC ....... *H10K 71/861* (2023.02); *H10K 59/1201* (2023.02); *H10K 59/8722* (2023.02)

(58) Field of Classification Search
CPC ............. H10K 71/861; H10K 59/1201; H10K 59/8722; G09G 2330/10
See application file for complete search history.

(56) References Cited

U.S. PATENT DOCUMENTS

2004/0160170 A1 8/2004 Sato et al.
2009/0009069 A1 1/2009 Takata
2017/0047540 A1* 2/2017 Kang .................... H10K 59/88
2019/0363275 A1 11/2019 Ochi et al.
2022/0077251 A1* 3/2022 Choung ............... H10K 59/873
2022/0344625 A1* 10/2022 Jeon ....................... H10K 59/38

FOREIGN PATENT DOCUMENTS

JP 2000-195677 A 7/2000
JP 2004-207217 A 7/2004
JP 2008-135325 A 6/2008
JP 2009-032673 A 2/2009
JP 2010-118191 A 5/2010
WO 2018/179308 A1 10/2018

* cited by examiner

*Primary Examiner* — Davienne N Monbleau
*Assistant Examiner* — Emily Farmer
(74) *Attorney, Agent, or Firm* — XSENSUS LLP

(57) ABSTRACT

According to one embodiment, a method of manufacturing a display device, includes forming a plurality of display elements each including a lower electrode, an organic layer which covers the lower electrode and an upper electrode which covers the organic layer, forming a first sealing layer which seals the plurality of display elements, individually, inspecting the plurality of display elements to determine whether any of the plurality of display elements entails a defect and forming, when in the inspection, it is confirmed that there is a defective one of the display elements, a repair hole which penetrates the first sealing layer which seals the defective one of the display elements.

20 Claims, 16 Drawing Sheets

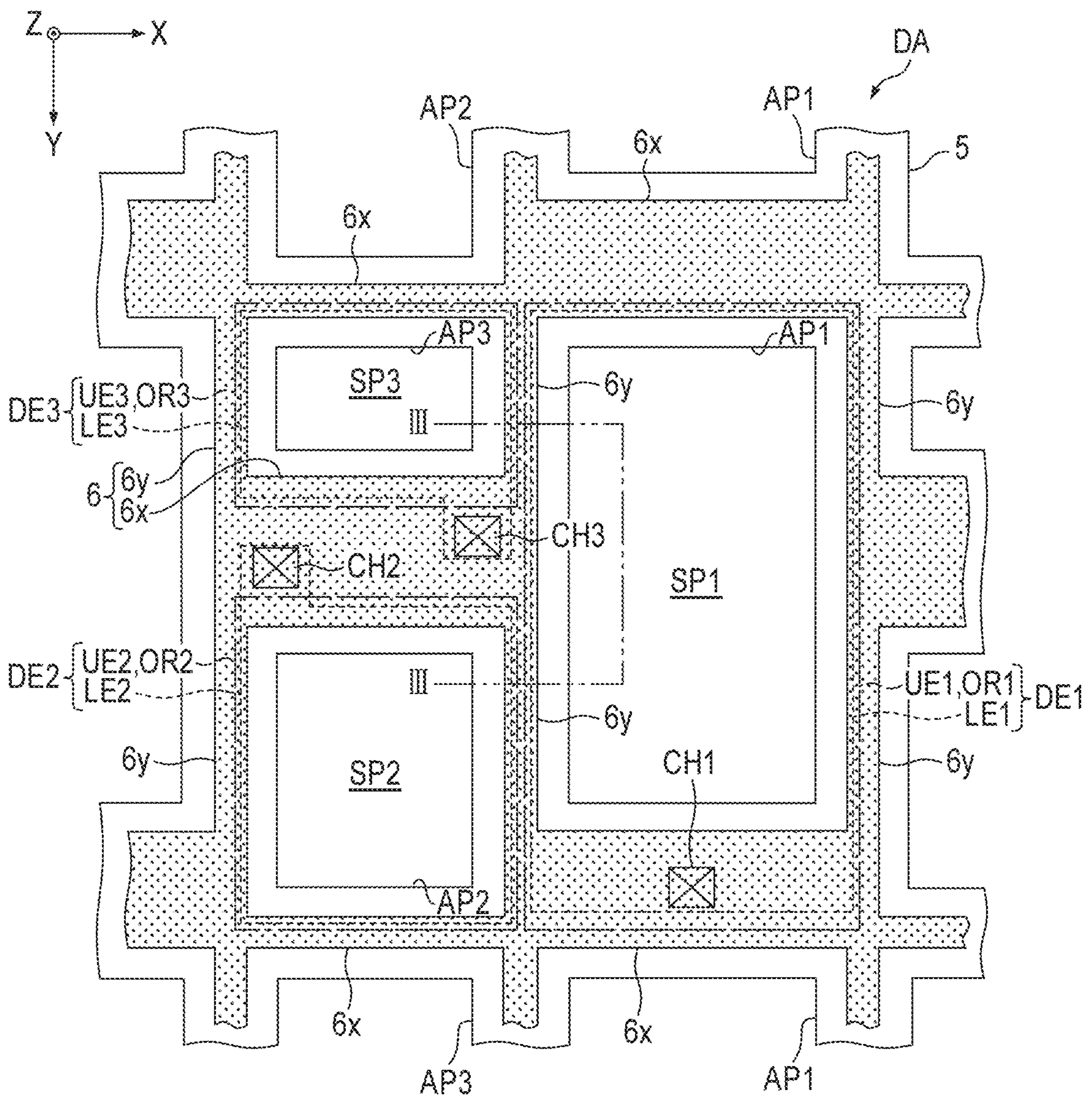
F I G. 2

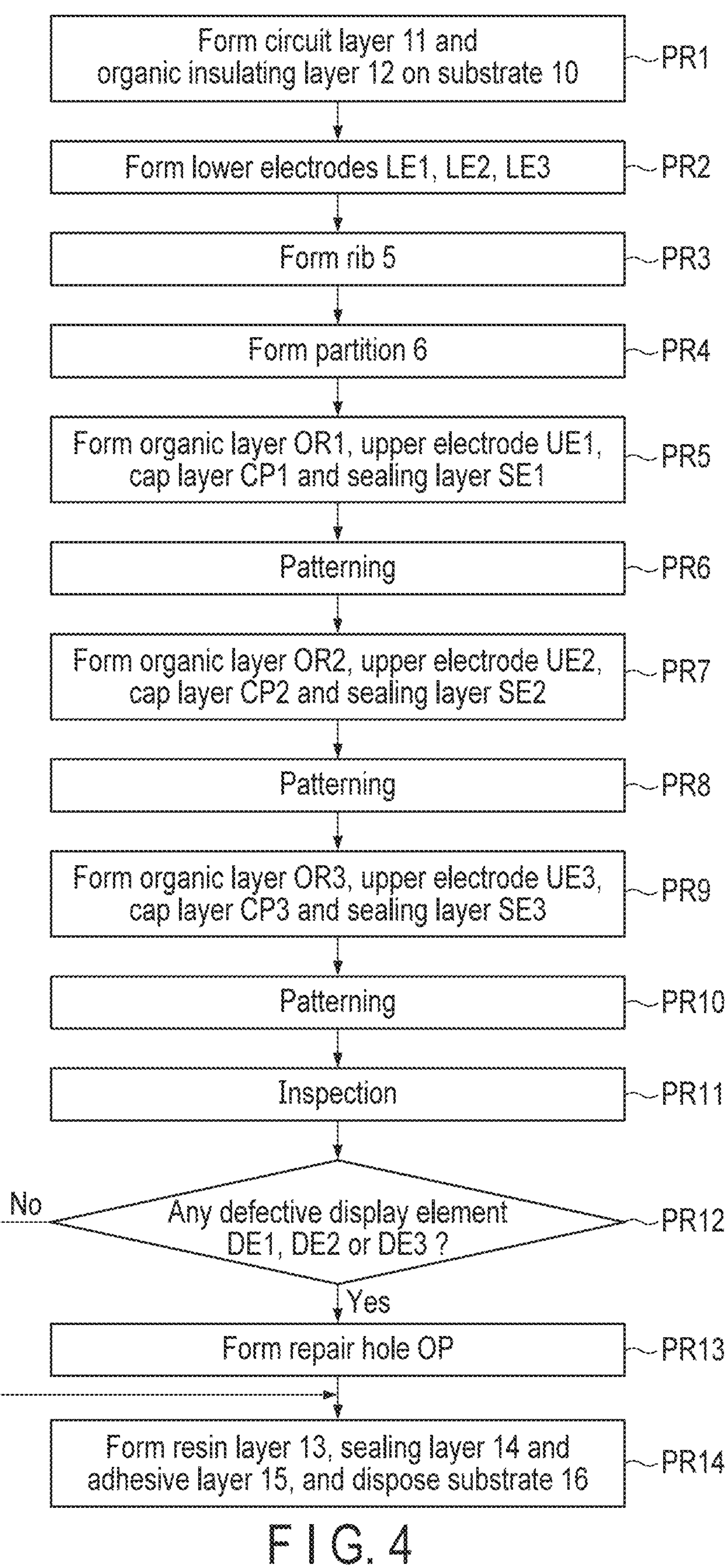
F I G. 4

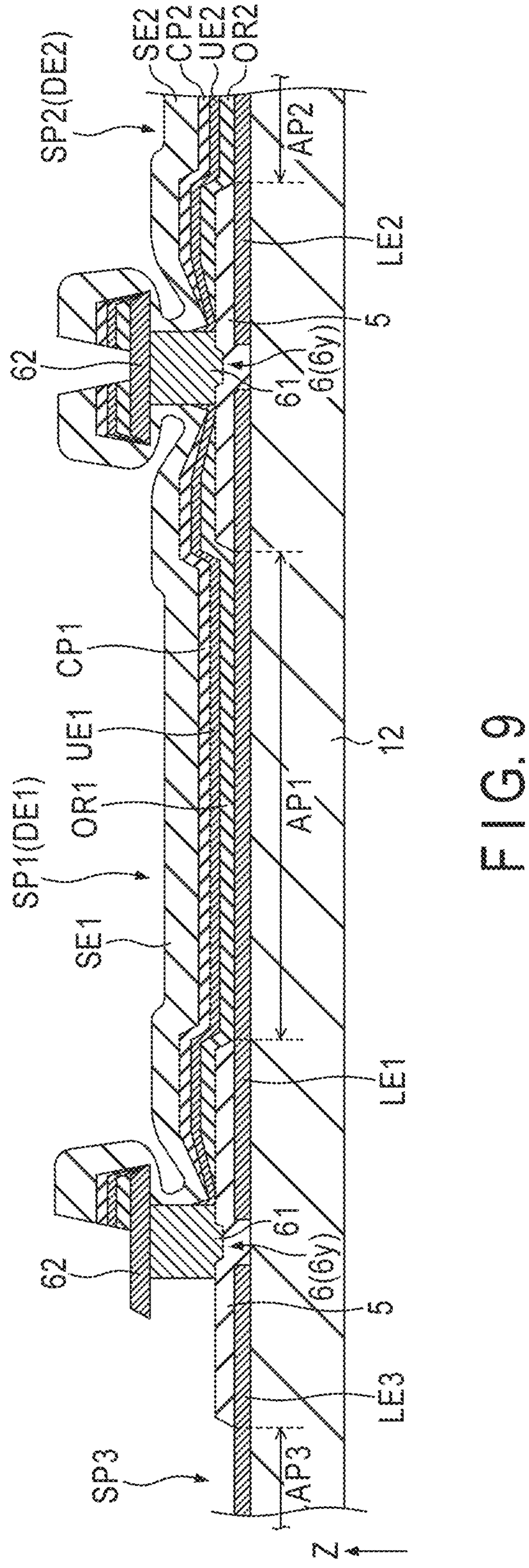
F I G. 9

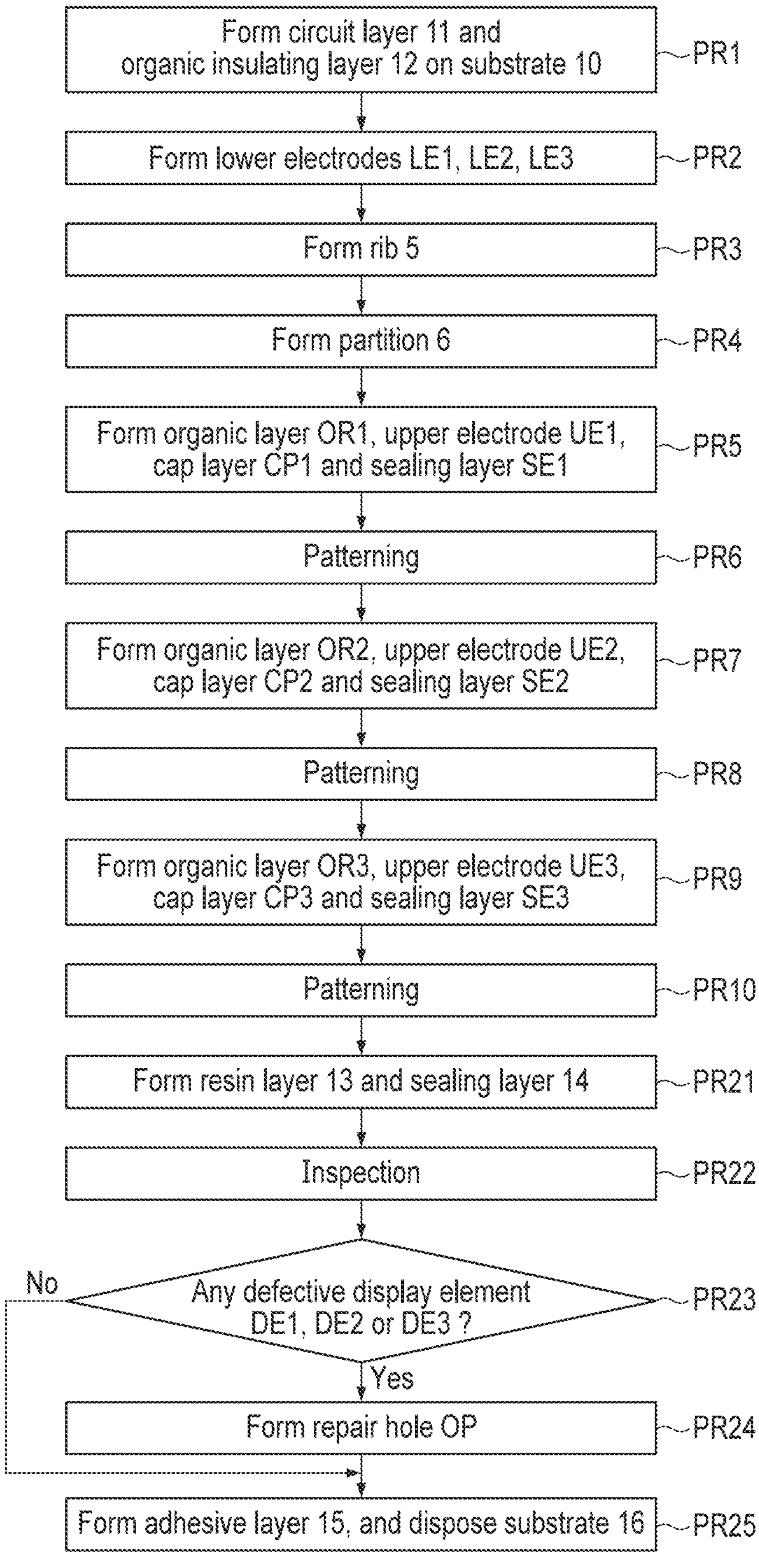
F I G. 14

DISPLAY DEVICE MANUFACTURING METHOD INCLUDING FORMING A REPAIR HOLE THAT PENETRATES A SEALING LAYER

CROSS-REFERENCE TO RELATED APPLICATIONS

This application is based upon and claims the benefit of priority from Japanese Patent Application No. 2022-166932, filed Oct. 18, 2022, the entire contents of which are incorporated herein by reference.

FIELD

Embodiments described herein relate generally to a method of manufacturing a display device.

BACKGROUND

In recent years, display devices to which an organic light-emitting diode (OLED) is applied as a display element have been put into practical use. Such a display element comprises a lower electrode, an organic layer which covers the lower electrode, and an upper electrode which covers the organic layer.

In manufacture of such display devices, there a demand of making the display element in the bright spot state non-luminescent to improve the display quality of the display device.

BRIEF DESCRIPTION OF THE DRAWINGS

FIG. 2 is a diagram showing an example of layout of subpixels.

FIG. 4 is a flowchart showing an example of a method of manufacturing a display device.

FIG. 9 is a schematic cross-sectional view showing a manufacturing step, which follows that of FIG. 8.

FIG. 14 is a flowchart showing an example of a method of manufacturing a display device according to the second embodiment.

DETAILED DESCRIPTION

Figure 1:
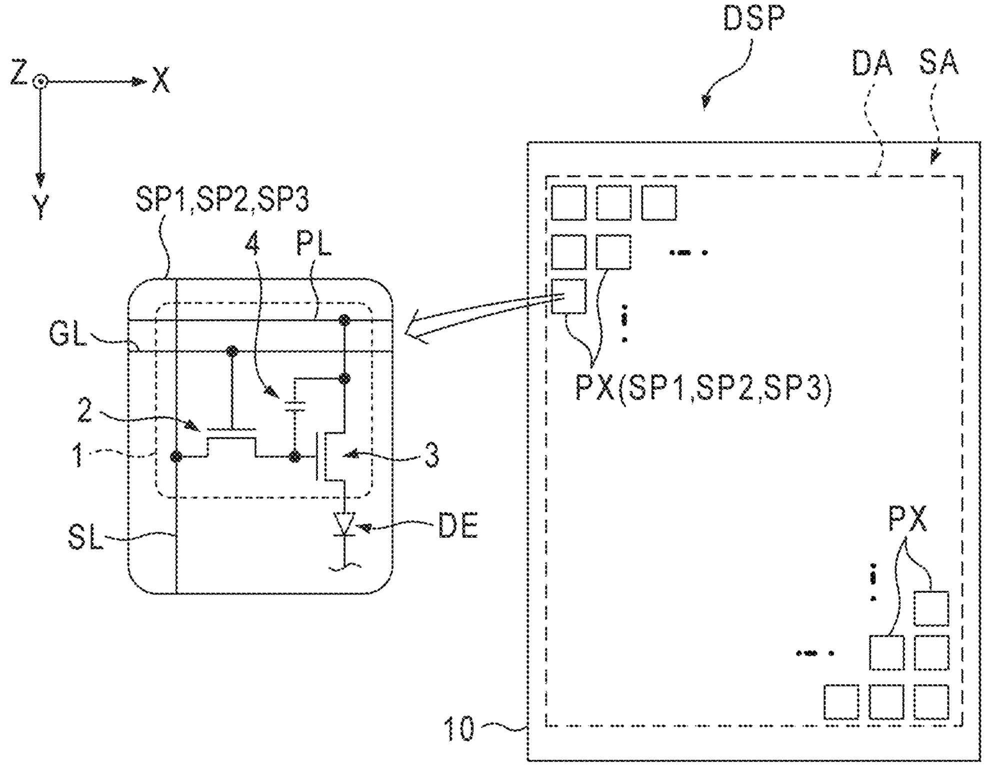
FIG. 1 is a diagram showing a configuration example of a display device according to the first embodiment.

In general, according to one embodiment, a method of manufacturing a display device comprises forming a plurality of display elements each including a lower electrode, an organic layer which covers the lower electrode and an upper electrode which covers the organic layer, forming a first sealing layer which seals the plurality of display elements, individually, inspecting the plurality of display elements to determine whether any of the plurality of display elements entails a defect and forming, when in the inspection, it is confirmed that there is a defective one of the display elements, a repair hole that penetrates the first sealing layer that seals the defective one of the display elements.

According to such configurations, it is possible to provide a method of manufacturing a display device, which can improve the display quality of the device.

Embodiments will be described with reference to the accompanying drawings.

Note that the disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

Note that in the drawings, in order to make it easier to understand, an X-axis, a Y-axis and a Z-axis orthogonal to each other are shown depending on the need. A direction parallel to the X-axis is referred to as a first direction, a direction parallel to the Y-axis is referred to as a second direction, and a direction parallel to the Z-axis is referred to as a third direction. The third direction Z is normal to a plane containing the first direction X and the second direction Y. Further, viewing structural elements parallel to a plane including the first direction X and the second direction Y is referred to as plan view.

The display device of each embodiment is an organic electroluminescent display device comprising an organic light-emitting diode (OLED) as a display element, and could be mounted on televisions, personal computers, in-vehicle devices, tablets, smartphones, mobile phones and the like.

First Embodiment

FIG. 1 is a diagram showing a configuration example of a display device DSP according to an embodiment. The display device DSP comprises a display area DA which displays images and a surrounding area SA around the display area DA, on an insulating substrate 10. The substrate 10 may be glass or a flexible resin film.

In this embodiment, the shape of the substrate 10 in plan view is rectangular. Note here that the shape of the substrate 10 in plan view is not limited to rectangular, but may as well be some other shape such as a square, circle or oval.

The display area DA comprises a plurality of pixels PX arranged in a matrix along the first direction X and the second direction Y. The pixels PX each include a plurality of subpixels SP1, SP2 and SP3. For example, the subpixels SP1 are blue, the subpixels SP2 are green and the subpixels SP3 are red. Note that the pixels PX may include a subpixel SP of some other color, such as white, together with or in place of any of the subpixels SP1, SP2 and SP3.

The subpixels SP1, SP2 and SP3 each comprise a pixel circuit 1 and a display element DE driven by the pixel circuit 1. The pixel circuit 1 comprises a pixel switch 2, a drive transistor 3 and a capacitor 4. The pixel switch 2 and the drive transistor 3 are switching elements constituted by thin-film transistors, for example.

A gate electrode of the pixel switch 2 is connected to a respective scanning line GL. One of source and drain electrodes of the pixel switch 2 is connected to a respective signal line SL, and the other is connected to a gate electrode of the drive transistor 3 and a capacitor 4. In the drive transistor 3, one of source and drain electrodes is connected to a feed line PL and the capacitor 4, and the other is connected to the display element DE.

The display element DE is an organic light emitting diode (OLED) as a light emitting element. For example, the subpixels SP1 comprise a display element DE which emits light of a wavelength range of blue color, the subpixels SP2 comprise a display element DE which emits light of a wavelength range of green color, and the subpixels SP3 comprise a display element DE which emits light of a wavelength range of red color.

Note that the configuration of the pixel circuit 1 is not limited to that of the example shown in the figure. For example, the pixel circuit 1 may as well comprise more thin-film transistors and capacitors.

FIG. 2 is a diagram showing an example of layout of the subpixels SP1, SP2 and SP3. In the example shown in FIG. 2, the subpixel SP1 and the subpixel SP2 are aligned along the first direction X. Further, the subpixel SP1 and the subpixel SP3 as well are aligned along the first direction X. Further, the subpixel SP2 and the subpixel SP3 are aligned along the second direction Y.

When the subpixels SP1, SP2 and SP3 have such a layout, rows in each of which subpixels SP2 and SP3 are arranged alternately along the second direction Y in the display area DA, and rows in each of which multiple subpixels SP1 are repeatedly arranged along the second direction Y in the display area DA. These rows are alternately arranged along the first direction X. Note that the layout of the subpixels SP1, SP2 and SP3 is not limited to that of the example shown in FIG. 2. As another example, the subpixels SP1, SP2, and SP3 in each pixel PX may as well be aligned in order along the first direction X.

In the display area DA, a rib 5 and a partition 6 are arranged. The rib 5 includes a pixel aperture AP1 in the subpixel SP1, a pixel aperture AP2 in the subpixel SP2 and a pixel aperture AP3 in the subpixel SP3.

In the example shown in FIG. 2, the pixel aperture AP1 is larger in area than the pixel aperture AP2 and the pixel aperture AP1 is larger in area than the pixel aperture AP3. Further, the area of the pixel aperture AP3 is smaller than that of the pixel aperture AP2.

The partition 6 is placed at the boundary of each pair of subpixels SP1, SP2 and SP3 adjacent to each other. The partition 6 overlaps the rib 5 in plan view. The partition 6 includes a plurality of first partitions 6*x* extending along the first direction X and a plurality of second partitions 6*y* extending along the second direction Y.

The first partitions 6*x* are each disposed between each respective pair of pixel apertures AP2 and pixel apertures AP3 adjacent to each other along the second direction Y and between each respective pair of pixel apertures AP1 adjacent to each other along the second direction Y. The second partitions 6*y* are each disposed between each respective pair of pixel apertures AP1 and pixel apertures AP2 adjacent to each other along the first direction X and between each respective pair of pixel apertures AP1 and pixel apertures AP3 adjacent to each other along the first direction X.

In the example shown in FIG. 2, the first partitions 6*x* and the second partitions 6*y* are connected to each other. With this structure, the partition 6, as a whole, has a lattice-like shape which surrounds the pixel apertures AP1, AP2 and AP3 as a whole. It can as well be said that the partition 6 includes apertures in the subpixels SP1, SP2 and SP3, respectively, as in the case of the rib 5.

The subpixel SP1 comprises a lower electrode LE1, an upper electrode UE1 and an organic layer OR1 each overlapping the pixel aperture AP1. The subpixel SP2 comprises a lower electrode LE2, an upper electrode UE2 and an organic layer OR2 each overlapping the pixel aperture AP2. The subpixel SP3 comprises a lower electrode LE3, an upper electrode UE3 and an organic layer OR3 each overlapping the pixel aperture AP3.

The lower electrode LE1, the upper electrode UE1 and the organic layer OR1 constitute the display element DE1 of the subpixel SP1. The lower electrode LE2, the upper electrode UE2 and the organic layer OR2 constitute the display element DE2 of the subpixel SP2. The lower electrode LE3, the upper electrode UE3 and the organic layer OR3 constitute the display element DE3 of the subpixel SP3. The display elements DE1, DE2 and DE3 may further include a cap layer, which will be described later.

The lower electrode LE1 is connected to the pixel circuit 1 of the subpixel SP1 (see FIG. 1) via a contact hole CH1. The lower electrode LE2 is connected to the pixel circuit 1 of the subpixel SP2 via a contact hole CH2. The lower electrode LE3 is connected to the pixel circuit 1 of the subpixel SP3 via a contact hole CH3.

In the example shown in FIG. 2, the contact holes CH2 and CH3 entirely overlap the first partition 6*x* located between each respective pair of pixel apertures AP2 and pixel apertures AP3 adjacent to each other along the second direction Y. The contact hole CH1 entirely overlaps the first partition 6*x* located between each respective pair of pixel apertures AP1 adjacent to each other along the second direction Y. As another example, at least a part of the contact holes CH1, CH2 and CH3 may not overlap the respective first partition 6*x*.

Figure 3:
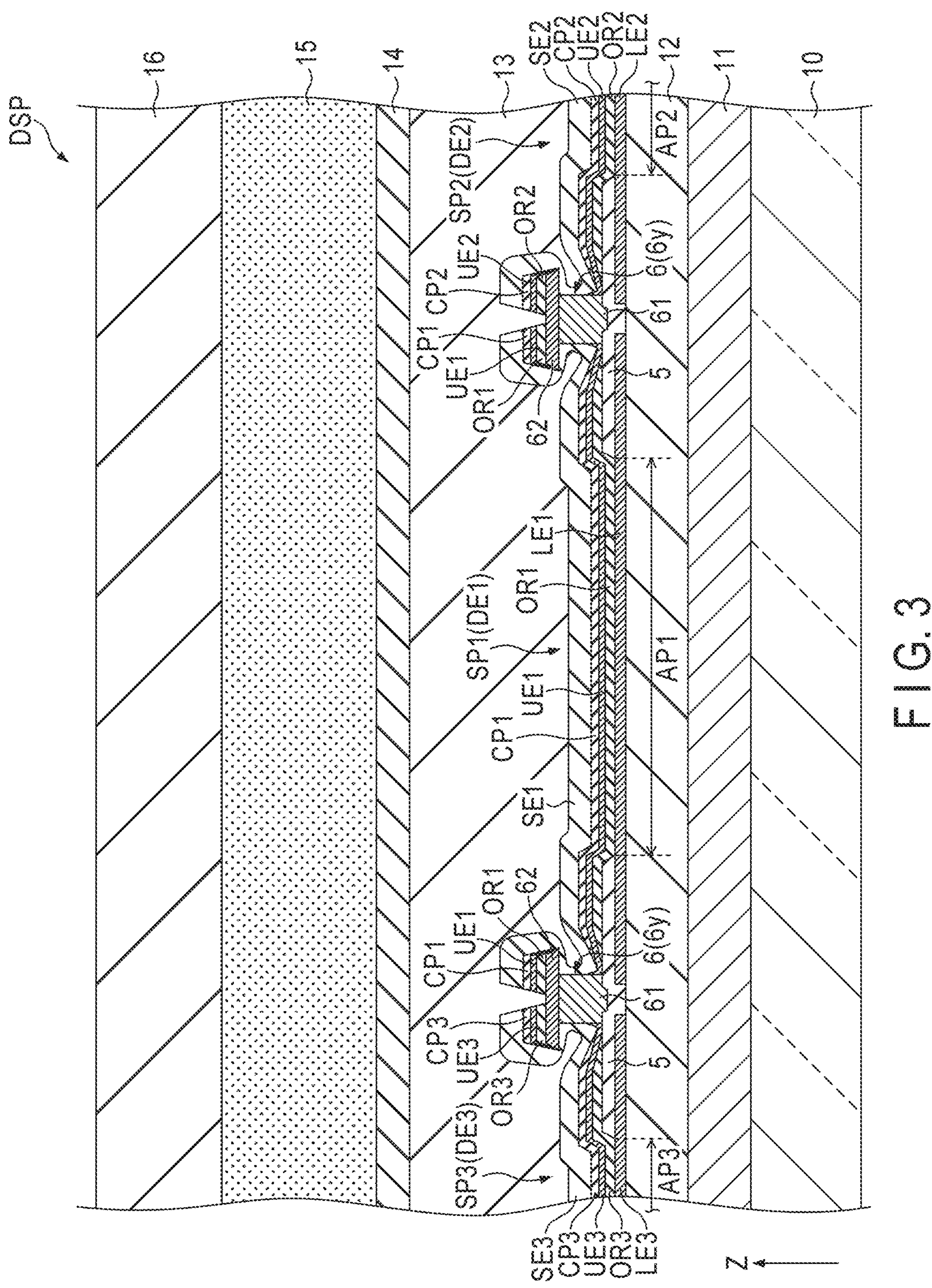
FIG. 3 is a schematic cross-sectional view of the display device taken along line III-III in FIG. 2.

FIG. 3 is a schematic cross-sectional view of the display device DSP taken along line III-III in FIG. 2. On the substrate 10 described above, a circuit layer 11 is disposed. The circuit layer 11 includes various circuits and wiring lines, such as the pixel circuit 1, scanning lines GL, signal lines SL, and feed lines PL shown in FIG. 1.

The circuit layer 11 is covered by an organic insulating layer 12. The organic insulating layer 12 functions as a planarization film that planarizes unevenness created by the circuit layer 11. The contact holes CH1, CH2 and CH3 described above are all disposed on the organic insulating layer 12, though not illustrated in the cross section shown in FIG. 3.

The lower electrodes LE1, LE2 and LE3 are disposed on the organic insulating layer 12. The rib 5 is disposed on the organic insulating layer 12 and the lower electrodes LE1, LE2 and LE3. End portions of the lower electrodes LE1, LE2 and LE3 are covered by the rib 5. The rib 5 includes the pixel apertures AP1, AP2 and AP3 described above.

The partition 6 includes a lower portion 61 having conductivity and disposed on the rib 5 and an upper portion 62 disposed on the lower portion 61. The upper portion 62 may as well have conductivity as in the case of the lower portion 61. The upper portion 62 has a width greater than that of the lower portion 61. With this configuration, in FIG. 3, both end portions of the upper portion 62 protrude beyond respective side surfaces of the lower portion 61. Such a shape of the partition 6 is referred to as overhanging type.

The organic layer OR1 covers the lower electrode LE1 through the pixel aperture AP1. The upper electrode UE1 covers the organic layer OR1 and opposes the lower electrode LE1. The organic layer OR2 covers the lower electrode LE2 through the pixel aperture AP2. The upper electrode UE2 covers the organic layer OR2 and opposes the lower electrode LE2. The organic layer OR3 covers the lower electrode LE3 through the pixel aperture AP3. The upper electrode UE3 covers the organic layer OR3 and opposes the lower electrode LE3.

In the example shown in FIG. 3, the cap layer CP1 is disposed on the upper electrode UE1, the cap layer CP2 is disposed on the upper electrode UE2, and the cap layer CP3 is disposed on the upper electrode UE3. The cap layers CP1, CP2 and CP3 adjust optical properties of light emitted by the organic layers OR1, OR2 and OR3, respectively.

A portion of each of the organic layer OR1, the upper electrode UE1 and the cap layer CP1 are located on the upper portion 62. This portion is separated from other portions of the organic layer OR1, the upper electrode UE1 and the cap layer CP1.

Similarly, a portion of each of the organic layer OR2, the upper electrode UE2 and the cap layer CP2 is located on the upper portion 62, and this portion is separated from other portions of the organic layer OR2, the upper electrode UE2 and the cap layer CP2.

Further, a portion of each of the organic layer OR3, the upper electrode UE3 and the cap layer CP3 is located on the upper portion 62, and this portion is separated from other portions of the organic layer OR3, the upper electrode UE3 and the cap layer CP3.

A sealing layer SE1 is located in the subpixel SP1, a sealing layer SE2 is located in the subpixel SP2, and a sealing layer SE3 is located in the subpixel SP3. In this embodiment, the sealing layers SE1, SE2, and SE3 correspond to the first sealing layer.

The sealing layer SE1 continuously covers the portion of the partition 6, which surrounds the subpixel SP1 and is closer to the subpixel SP1, and the cap layer CP1. The sealing layer SE2 continuously covers the portion of the partition 6, which surrounds the subpixel SP2 and is closer to the subpixel SP2, and the cap layer CP2. The sealing layer SE3 continuously covers the portion of the partition 6, which surrounds the subpixel SP3 and is closer to the subpixel SP3, and the cap layer CP3.

End portions (circumferential edge portions) of the sealing layers SE1 SE2, and SE3 are located on the upper portion 62. In the example shown in FIG. 3, the organic layer OR1, the upper electrode UE1, the cap layer CP1 and the sealing layer SE1, which are located on the upper portion 62 of the left portion of the partition 6, are separated from the organic layer OR3, the upper electrode UE3, the cap layer CP3, and the sealing layer SE3, which are located on the upper portion 62.

Further, the organic layer OR1, the upper electrode UE1, the cap layer CP1 and the sealing layer SE1, located on the upper portion 62 of the right portion of the partition 6, are separated from the organic layer OR2, the upper electrode UE2, the cap layer CP2 and the sealing layer SE2, located on the upper portion 62.

The partition 6 is placed at the boundary of each pair of subpixels SP1, SP2 and SP3 adjacent to each other. More specifically, the lower portions 61 of the second partitions 6*y* (left side of the figure) are located between the organic layer OR1 and the organic layer OR3, between the upper electrode UE1 and the upper electrode UE3 and between the cap layer CP1 and the cap layer CP3, respectively.

Similarly, the lower portions 61 of the second partitions 6*y* (right side of the figure) are located between the organic layer OR1 and the organic layer OR2, between the upper electrode UE1 and the upper electrode UE2, and between the cap layer CP1 and the cap layer CP2, respectively. The sealing layers SE1, SE2 and SE3 individually seal a plurality of display elements DE1, DE2 and DE3.

The sealing layers SE1, SE2 and SE3 are covered by a resin layer 13. The resin layer 13 is covered by a sealing layer 14 (second sealing layer). The display device DSP further comprises a substrate 16 opposing the sealing layer 14. The substrate 16 is adhered to the sealing layer 14 by a transparent adhesive layer 15. The sealing layer 14 is covered by the adhesive layer 15.

The organic insulating layer 12 and the resin layer 13 are formed of an organic insulating material. As the adhesive layer 15, an optical clear adhesive (OCA) can be used.

The rib 5, the sealing layers SE1, SE2 and SE3, and the sealing layer 14 are each formed of, for example, an inorganic insulating material such as silicon nitride (SiNx), silicon oxide (SiOx) or silicon oxynitride (SiON).

The lower electrodes LE1, LE2 and LE3 each include an intermediate layer formed of silver (Ag), for example, and a pair of conductive oxide layers which respectively cover an upper surface and lower surface of the intermediate layer. Each conductive oxide layer can be formed, for example, of a transparent conductive oxide such as indium tin oxide (ITO), indium zinc oxide (IZO) or indium gallium zinc oxide (IGZO).

The upper electrodes UE1, UE2 and UE3 are each formed, for example, of a metallic material such as an alloy of magnesium and silver (MgAg). For example, the lower electrodes LE1, LE2 and LE3 correspond to anodes, and the upper electrodes UE1, UE2 and UE3 correspond to cathodes.

The organic layers OR1, OR2 and OR3 have a stacked layer structure of, for example, a hole injection layer, a hole transport layer, an electron blocking layer, a light emitting layer, a hole blocking layer, an electron transport layer and an electron injection layer. The organic layers OR1, OR2 and OR3 may each as well include multiple light emitting layers.

The cap layers CP1, CP2 and CP3 are formed, for example, of a stacked layer body of a plurality of transparent thin films. The stacked layer body may as well include, as the plurality of thin films, a thin film formed of an inorganic material and a thin film formed by an organic material.

Further, these plurality of thin films have refractive indices different from each other. The material of the thin films which constitute the stacked layer body is different from the material of the upper electrodes UE1, UE2 and UE3 and also from the material of the sealing layers SE1, SE2 and SE3. Note here that the cap layers CP1, CP2 and CP3 may be omitted.

To the partition 6, a common voltage is supplied. The common voltage is supplied to each of the upper electrodes UE1, UE2 and UE3, which are in contact with a side surface of the lower portion 61. To the lower electrodes LE1, LE2 and LE3, a pixel voltage is supplied through the respective pixel circuits 1 of the subpixels SP1, SP2 and SP3.

The organic layers OR1, OR2 and OR3 emit light according to the voltage applied thereto. More specifically, when a potential difference is created between the lower electrode LE1 and the upper electrode UE1, the light emitting layer of the organic layer OR1 emits light of a wavelength range of blue color. When a potential difference is created between the lower electrode LE2 and the upper electrode UE2, the light emitting layer of the organic layer OR2 emits light of a wavelength range of green color. When a potential difference is created between the lower electrode LE3 and the upper electrode UE3, the light emitting layer of the organic layer OR3 emits light of a wavelength range of red color.

The substrate 16 is, for example, an optical element such as a polarizer, a protective film, a cover glass or a touch panel. The substrate 16 may as well be a staked layer body consisting of two or more kinds of elements with different functions, such as an optical element, protective film, cover glass and touch panel, bonded all together with an adhesive layer.

Now, a method of manufacturing the display device DSP will be described.

FIG. 4 is a flowchart showing an example of a method of manufacturing the display device DSP.

FIGS. 5 to 12 are schematic cross-sectional views each showing a respective part of the process of manufacturing the display device DSP. In FIGS. 5 to 12, the substrate 10 and the circuit layer 11 are omitted from illustration.

In the manufacture of the display device DSP, first, the circuit layer 11 and the organic insulating layer 12 are formed on the substrate 10 (process PR1).

Figure 5:
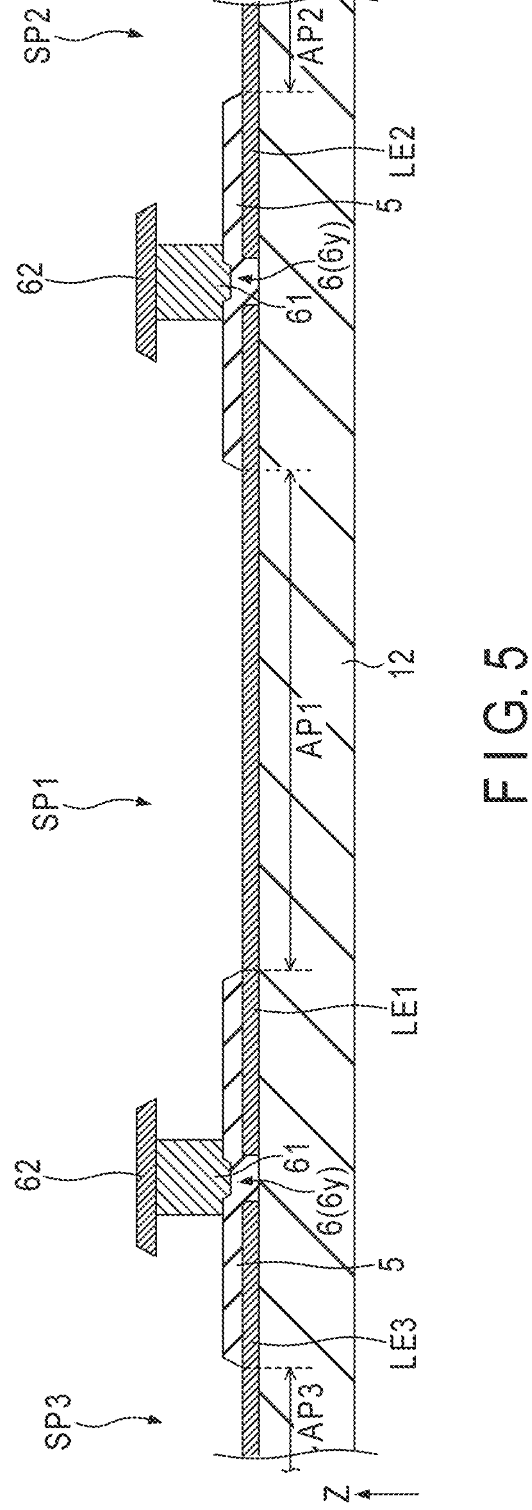
FIG. 5 is a schematic cross-sectional view of a part of the manufacturing process of the display device.

After the process PR1, as shown in FIG. 5, the lower electrodes LE1, LE2 and LE3 are formed on the organic insulating layer 12 (process PR2), and the rib 5 is formed to cover the lower electrodes LE1, LE2 and LE3 (process PR3). Further, the partition 6 is formed to be disposed on the rib 5 (process PR4). Note here that the pixel apertures AP1, AP2 and AP3 may be formed before or after the process PR4.

Subsequently, the processes for forming a plurality of display elements DE1, DE2 and DE3 are carried out. In this embodiment, it is assumed that the display element DE1 is formed first, the display element DE2 is formed next, and then the display element DE3 is formed last. But the order of formation of the display elements DE1, DE2 and DE3 is not limited to that of this example.

Figure 6:
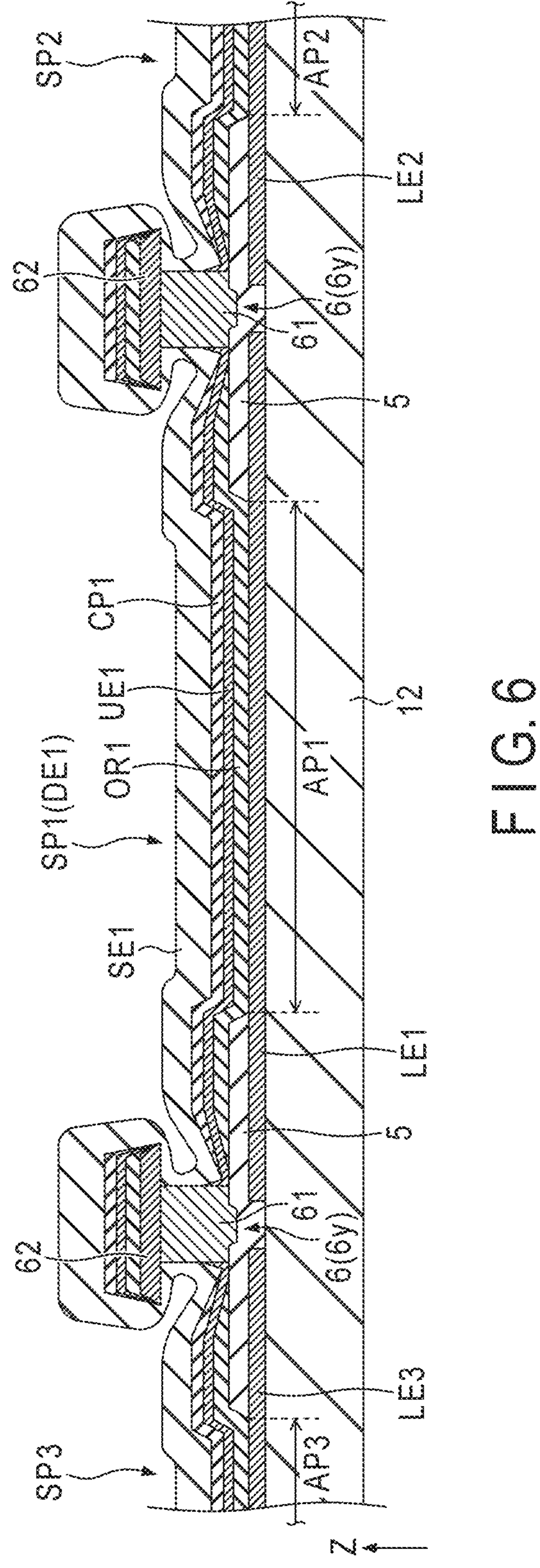
FIG. 6 is a schematic cross-sectional view showing a manufacturing step, which follows that of FIG. 5.

In the formation of the display element DE1, as shown in FIG. 6, the organic layer OR1 in contact with the lower electrode LE1 via the pixel aperture AP1, the upper electrode UE1 covering the organic layer OR1 and the cap layer CP1 covering the upper electrode UE1 are formed in sequence by vapor deposition, and the sealing layer SE1 continuously covering the cap layer CP1 and the partition 6 is formed by chemical vapor deposition (CVD) (process PR5).

The organic layer OR1, the upper electrode UE1, the cap layer CP1 and sealing layer SE1 are formed at least for the entire display area DA, and are located not only in the subpixel SP1 but also in the subpixels SP2 and SP3. The organic layer OR1, the upper electrode UE1 and the cap layer CP1 are divided by the overhanging partition 6.

Figure 7:
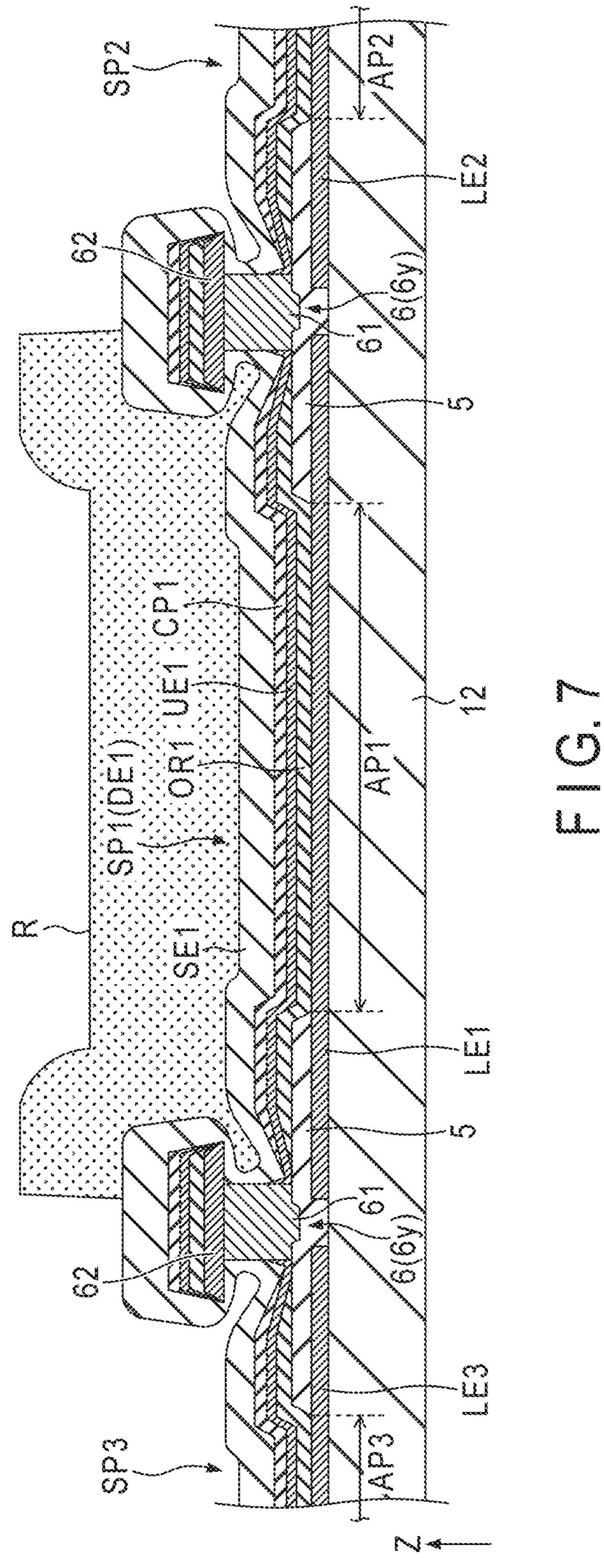
FIG. 7 is a schematic cross-sectional view showing a manufacturing step, which follows that of FIG. 6.

In the flowchart shown in FIG. 4, after the process PR5, the organic layer OR1, the upper electrode UE1, the cap layer CP1 and the sealing layer SE1 are patterned (process PR6). In this patterning, a resist R is disposed on the sealing layer SE1 as shown in FIG. 7. The resist R covers the subpixel SP1 and a part of the partition 6 therearound.

Figure 8:
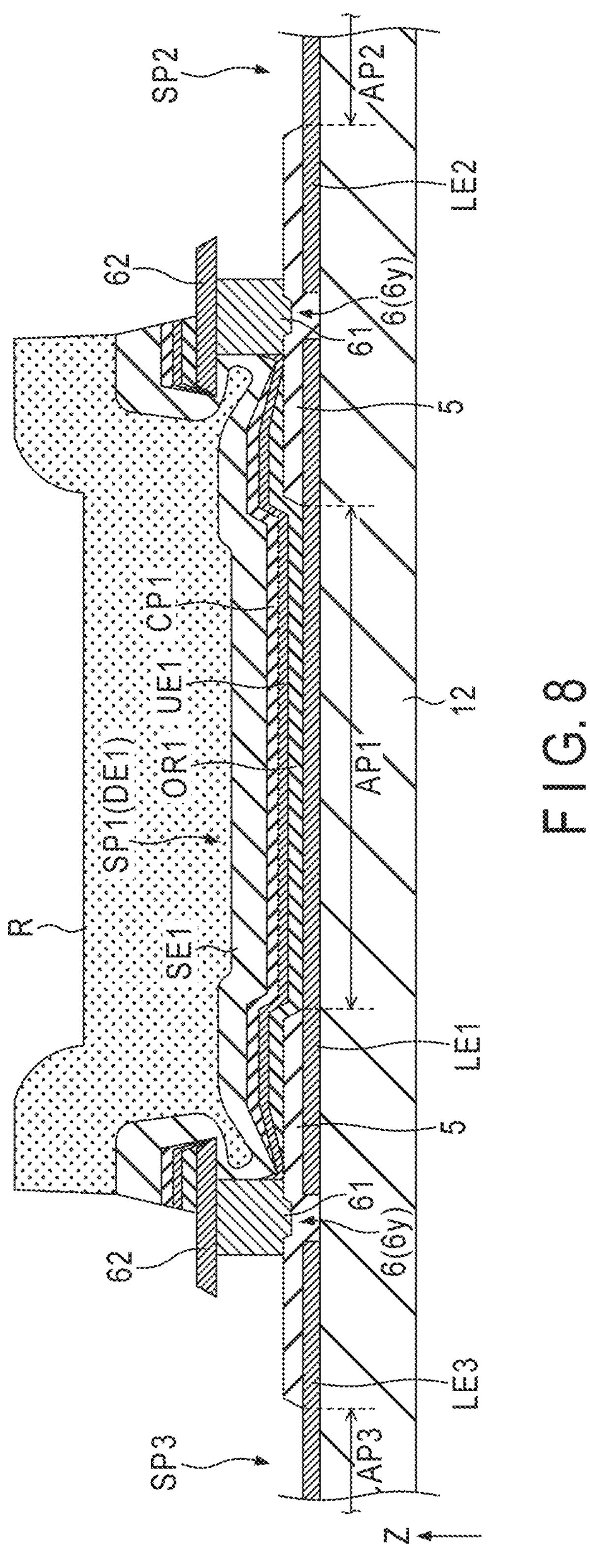
FIG. 8 is a schematic cross-sectional view showing a manufacturing step, which follows that of FIG. 7.

After that, by etching using the resist R as a mask, portions of the organic layer OR1, the upper electrode UE1, the cap layer CP1 and the sealing layer SE1, which are exposed from the resist R are removed, as shown in FIG. 8. This etching includes wet etching and dry etching performed in sequence on, for example, the sealing layer SE1, the cap layer CP1, the upper electrode UE1 and the organic layer OR1.

After the process shown in FIG. 8, the resist R is removed. Thus, a substrate in which the display element DE1 and the sealing layer SE1 are formed in the subpixel SP1 and a display element and a sealing layer are not formed in the subpixels SP2 and SP3, can be obtained.

The display element DE2 is formed by a procedure similar to that of display element DE1. That is, after the process PR6, the organic layer OR2 in contact with the lower electrode LE2 via the pixel aperture AP2, the upper electrode UE2 covering the organic layer OR2 and the cap layer CP2 covering the upper electrode UE2 are formed in sequence by vapor deposition, and further the sealing layer SE2 continuously covering the cap layer CP2 and the partition 6 is formed by CVD (process PR7).

The organic layer OR2, the upper electrode UE2, the cap layer CP2 and the sealing layer SE2 are formed at least for the entire display area DA, and are disposed not only in the subpixel SP2 but also in the subpixels SP1 and SP3.

After the process PR7, the organic layer OR2, the upper electrode UE2, the cap layer CP2 and the sealing layer SE2 are patterned by wet etching and dry etching (process PR8). The flow of this patterning is similar to that of the process PR6.

After through the process PR8, as shown in FIG. 9, a substrate in which the display element DE1 and the sealing layer SE1 are formed in the subpixel SP1, the display element DE2 and the sealing layer SE2 are formed in the subpixel SP2, and a display element and a sealing layer are not formed in the subpixel SP3, can be obtained.

The display element DE3 is formed by a procedure similar to that of the display elements DE1 and DE2. That is, after the process PR8, the organic layer OR3 in contact with the lower electrode LE3 via the pixel aperture AP3, the upper electrode UE3 covering the organic layer OR3 and the cap layer CP3 covering the upper electrode UE3 are formed in sequence by vapor deposition, and the sealing layer SE3 continuously covering the cap layer CP3 and the partition 6 is formed by CVD (process PR9).

The organic layer OR3, the upper electrode UE3, the cap layer CP3 and the sealing layer SE3 are formed at least for the entire display area DA, and are disposed not only in the subpixel SP3 but also in the subpixels SP1 and SP2.

After the process PR9, the organic layer OR3, the upper electrode UE3, the cap layer CP3 and the sealing layer SE3 are patterned by wet etching and dry etching (process PR10). The flow of this patterning is similar to those of the processes PR6 and PR8.

Figure 10:
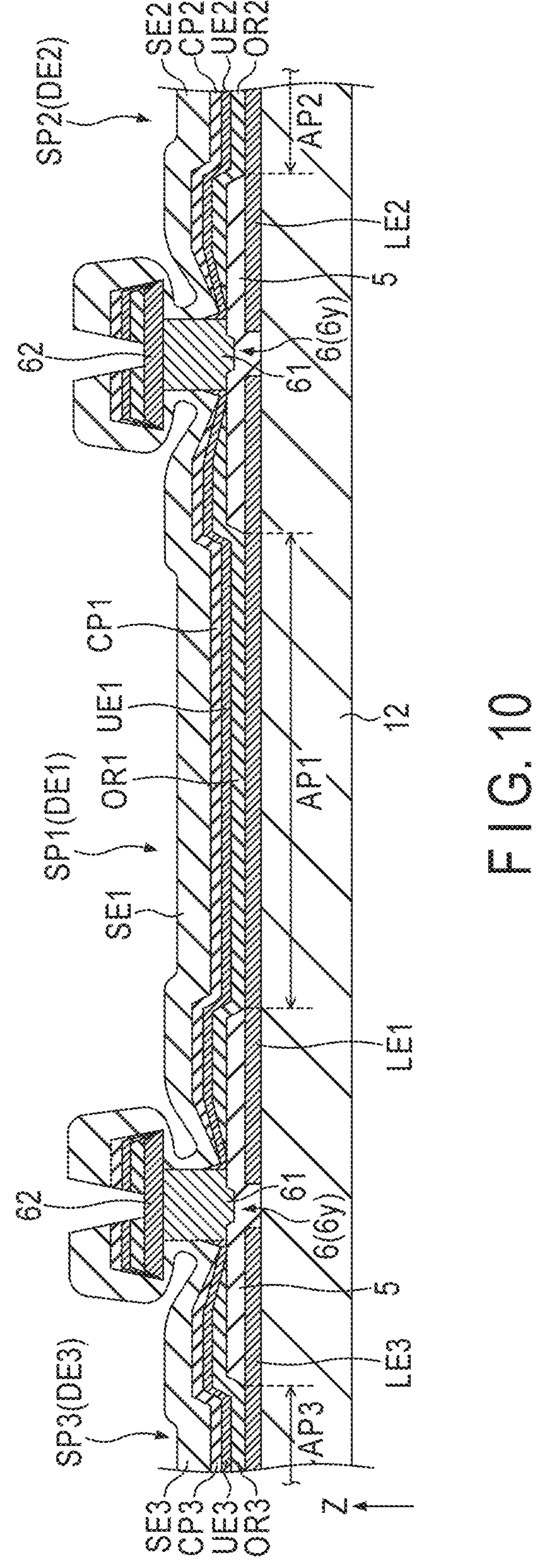
FIG. 10 is a schematic cross-sectional view showing a manufacturing step, which follows that of FIG. 9.

After through the process PR10, as shown in FIG. 10, a substrate in which the display element DE1 and the sealing layer SE1 are formed in the subpixel SP1, the display element DE2 and the sealing layer SE2 are formed in the subpixel SP2 and the display element DE3 and the sealing layer SE3 are formed in the subpixel SP3, can be obtained.

After the process PR10, a process for inspecting the display elements DE1, DE2 and DE3 is performed (process PR11). The inspection of the display elements DE1, DE2 and DE3 is performed, for example, by applying a voltage to each of the display elements DE1, DE2 and DE3 to make the organic layers OR1, OR2 and OR3 emit light.

By the inspection of the process PR11, it is confirmed as to whether or not any of the display elements DE1, DE2 and DE3 involves a defect (process PR12). In the inspection of the process PR11, for example, if any one of the display elements DE1, DE2 and DE3 in a bright spot state is confirmed, it is determined that there is a defect in any of the display elements DE1, DE2 and DE3 (Yes in process PR12).

Here, the term "bright spot state" means a state in which the display element emits light at a high luminance at all times regardless of the signal (pixel voltage) supplied to the pixel circuit 1 (shown in FIG. 1) via the signal line SL. A display element in a bright spot state such as this can be one factor of the degradation of the display quality of the display device DSP.

When it is determined that there is no display elements DE1, DE2 and/or DE3 with a defect (No in process PR12), the resin layer 13, the sealing layer 14 and the adhesive layer 15 are formed in order, and the substrate 16 is disposed on the adhesive layer 15 (process PR14).

Here, let us assume the case where at least one display element DE1 has a defect. When it is determined that there is a defect in a display element DE1 (Yes in process PR12), a repair hole OP, which penetrates at least the sealing layer SE1, is formed (process PR13), as shown in FIG. 11.

The repair hole OP includes at least a through hole P1 that penetrates the sealing layer SE1. The repair hole OP overlaps the cap layer CP1, the upper electrode UE1, the organic layer OR1, and the lower electrode LE1.

Figure 11:
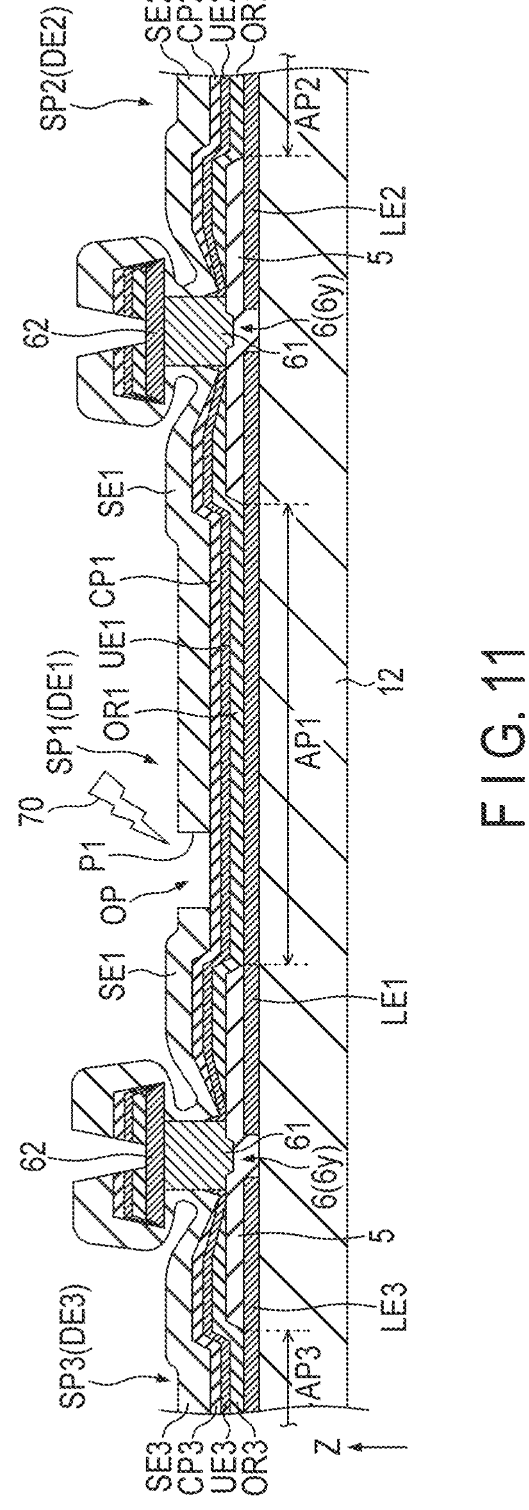
FIG. 11 is a schematic cross-sectional view showing a manufacturing step, which follows that of FIG. 10.

The repair hole OP is formed at a position overlapping the pixel aperture AP1 in the example shown in FIG. 11. The depth of the repair hole OP is substantially equal to the thickness of the portion of the sealing layer SE1, which overlaps the pixel aperture AP1.

The area of the repair hole OP is smaller than the area of the pixel aperture AP1 in the example shown in FIG. 11. The repair hole OP is formed, for example, by irradiating a laser beam 70 toward the sealing layer SE1 as shown in FIG. 11. The laser beam 70 is irradiated from a YAG laser in one example, but this operation is not limited to that of this example.

After through the process PR13, as shown in FIG. 11, a substrate with the repair holes OP formed therein can be obtained. Through the repair holes OP thus formed, moisture can enter the display element DE1.

In the example shown in FIG. 11, the cap layer CP1 is exposed through the repair holes OP. With this configuration, moisture can infiltrate from the cap layer CP1 toward the organic layer OR1. The moisture may be, for example, moisture in the atmosphere. Further, this moisture may as well be that contained in a cleaning solution used in the cleaning process after the process PR13 on. Note here a further process may be implemented to allow moisture to enter the display element DE1 through the repair hole OP after the process PR13.

As moisture enters the display element DE1, the degradation of the organic layer OR1 occurs, and the defective display element DE1 changes from a bright spot state to a dead spot state, in which no light is emitted. Thus, the bright spot state is canceled.

Figure 12:
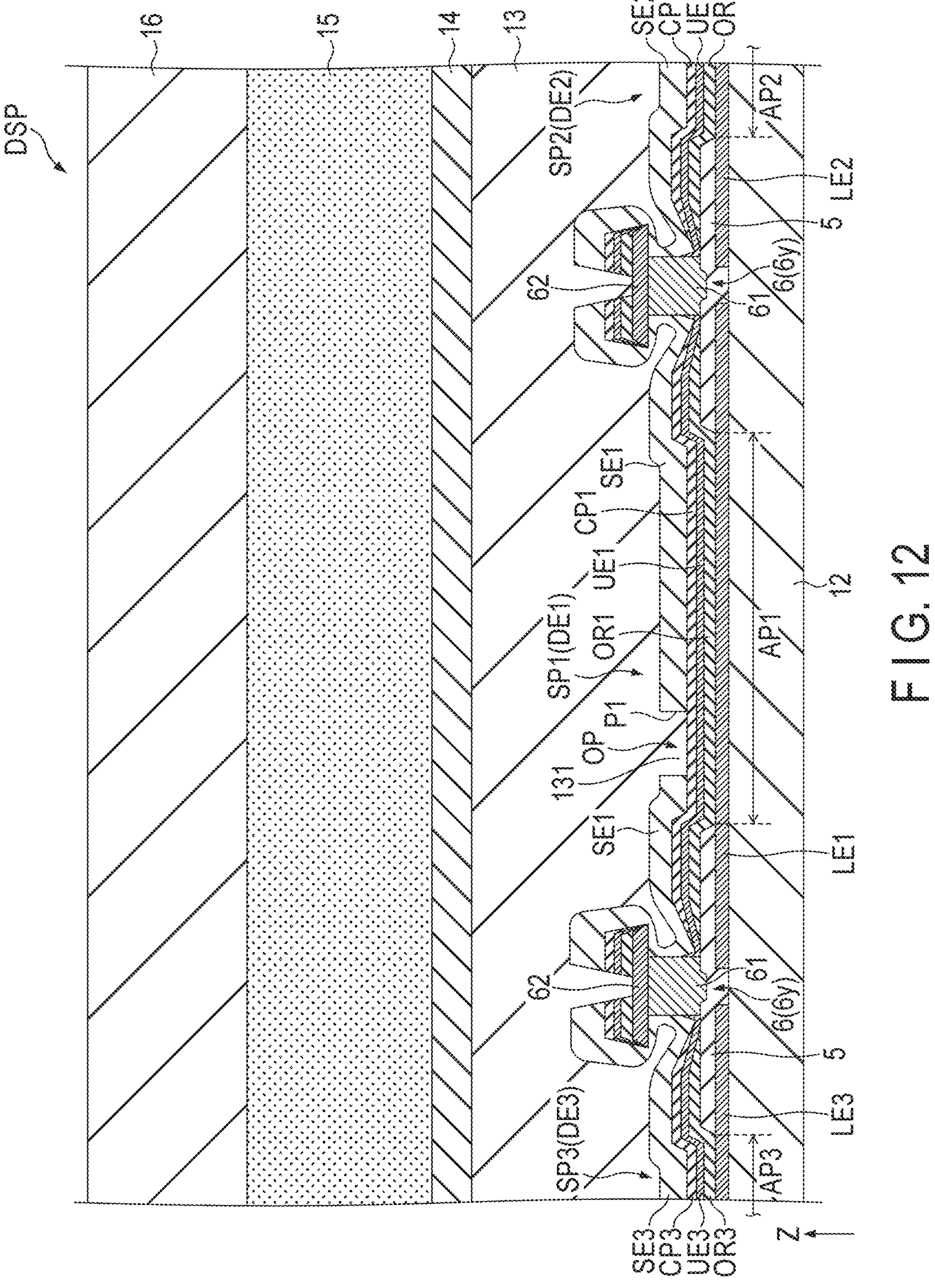
FIG. 12 is a schematic cross-sectional view showing a manufacturing step, which follows that of FIG. 11.

After the repair hole OP is formed, as shown in FIG. 12, the resin layer 13, the sealing layer 14 and the adhesive layer 15 are formed in order, and the substrate 16 is disposed on the adhesive layer 15 (process PR14). Thus, the display device DSP is completed.

When the resin layer 13 is formed on the sealing layer SE1, a part of the resin layer 13 fills the repair hole OP. Therefore, the resin layer 13 includes a filling portion 131 located in the repair hole OP. Moisture contained in the resin layer 13 may enter through the repair holes OP to make the display element DE1 to be in a dead spot state.

Figure 13:
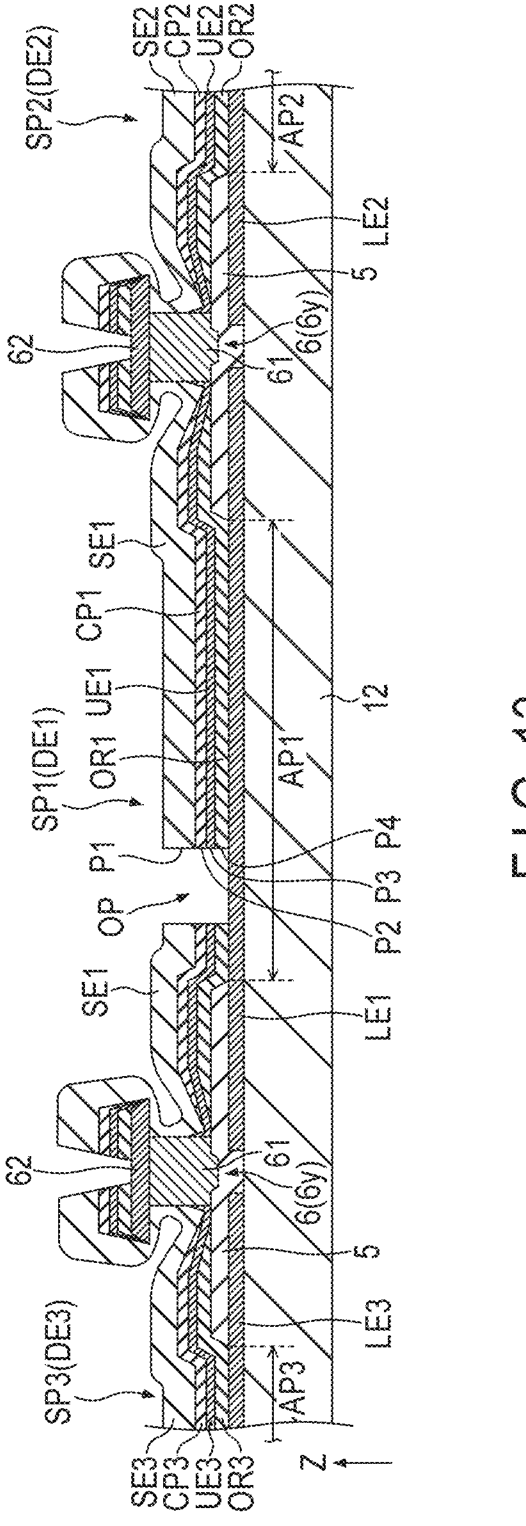
FIG. 13 is a schematic cross-sectional view showing another example of a configuration applicable to a repair hole.

FIG. 13 is a schematic cross-sectional view showing another example of a structure that can be applied to the repair hole OP. In the example shown in FIG. 13, the repair hole OP penetrates the sealing layer SE1, the cap layer CP1, the upper electrode UE1 and the organic layer OR1. In other words, the repair hole OP includes a through hole P1 formed in the sealing layer SE1, a through hole P2 formed in the cap layer CP1, a through hole P3 formed in the upper electrode UE1 and a through hole P4 formed in the organic layer OR1.

As another example, the repair hole OP may penetrate the sealing layer SE1, the cap layer CP1 and the upper electrode UE1 and not through the organic layer OR1. In other words, the repair hole OP may have the through hole P1 formed in the sealing layer SE1, the through hole P2 formed in the cap layer CP1, the through hole P3 formed in the upper electrode UE1, and may not have the through hole P4 formed in the organic layer OR1.

As still another example, the repair hole OP may penetrate the sealing layer SE1 and the cap layer CP1 and may not penetrate the organic layer OR1 and the upper electrode UE1. In other words, the repair hole OP may include the through hole P1 formed in the sealing layer SE1 and the through hole P2 formed in the cap layer CP1, and may not include the through hole P3 formed in the upper electrode UE1 and the through hole P4 formed in the organic layer OR1.

By making the repair holes OP deeper, moisture can easily enter the organic layer OR1. As a result, the display element DE1 with defects can be reliably made non-luminescent. However, if the repair hole OP penetrates the lower electrode LE1, moisture can infiltrate the organic insulating layer 12 and the circuit layer 11 therebelow. Therefore, it is preferable that the repair hole OP should not penetrate the lower electrode LE1.

In this embodiment, such a case is assumed that the display element DE1 entails a defect, but in the case where the display elements DE2 or DE3 is defective, a repair hole OP is formed in the process PR13.

When the display element DE2 entails a defect, a repair hole OP which penetrates at least the sealing layer SE2 is formed. When the display element DE3 entails a defect, a repair hole OP is formed at least through the sealing layer SE3.

When there are a plurality of display elements DE1, DE2 and DE3 which are defective, a repair hole OP is formed for each of the display elements DE1, DE2 and DE3 which are defective.

If there is a display element DE1, DE2 or DE3 in a bright spot state, its display color will be visually recognizable to the user, and therefore the display quality of the display device DSP is deteriorated. By contrast, in the method of manufacturing the display device DSP according to this embodiment, when a defective display element DE1, DE2 or DE3 is detected in the inspection process, a repair hole OP is formed in the sealing layer SE1, SE2 or SE3 which covers the defective one of the display element DE1, DE2 or DE3, respectively.

In this way, the defective display element DE1, DE2 or DE3 changes from a bright spot state to a dead spot state. As a result, the deterioration in display quality of the display device DSP due to the defective display element DE1, DE2 or DE3 can be suppressed.

In this embodiment, the sealing layers SE1, SE2 and SE3 individually seal a plurality of display elements DE1, DE2 and DE3, respectively. More specifically, the partition 6 disposed on the rib 5 is located between the pixel apertures AP1, AP2 and AP3 of each respective pair of subpixels SP1, SP2 and SP3 adjacent to each other. Each adjacent pair of the organic layers OR1, OR2 and OR3, the upper electrodes UE1, UE2 and UE3 and the cap layers CP1, CP2 and CP3 is divided from each other by the partition 6.

With this configuration, it is possible to prevent moisture entering through the repair holes OP from infiltrating from the defective one of the display elements DE1, DE2 and DE3 to a normal one of the display elements DE1, DE2 and DE3, which is adjacent thereto. In addition, the rib 5 is formed of an inorganic insulating material, and therefore it is also possible to prevent moisture from infiltrating to a normal one of the display elements DE1, DE2 and DE3, which is adjacent thereto thorough the rib 5.

As a result, in addition to the defective display elements DE1, DE2 and/or DE3, the normal one of the display elements DE1, DE2 and DE3, which is adjacent thereto also is set in the dead spot state, and thus the creation of the so-called dark spots in the display area DA can be suppressed. In other words, according to this embodiment, defective ones of the display elements DE1, DE2 and DE3 can be selectively set in non-luminous.

As described above, according to the configuration of this embodiment, it is possible to provide a method of manufacturing a display device DSP with an improved display quality. In addition, various other advantageous effects can be obtained from this embodiment.

Second Embodiment

The second embodiment will now be described. As to the configurations of the display device DSP of this embodiment, which are not specifically referred to, similar ones to those in the first embodiment can be applied.

Figure 15:
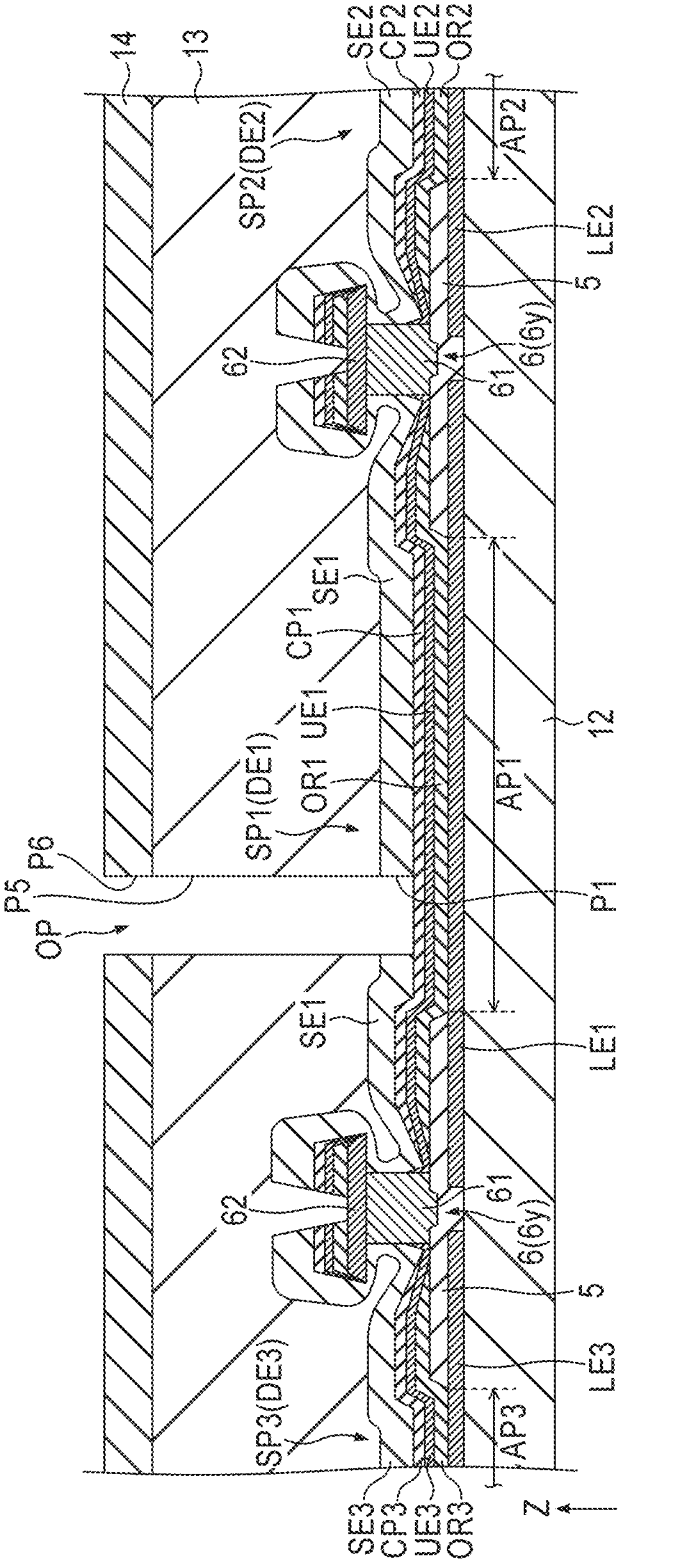
FIG. 15 is a schematic cross-sectional view of a part of the manufacturing process of the display device.
Figure 16:
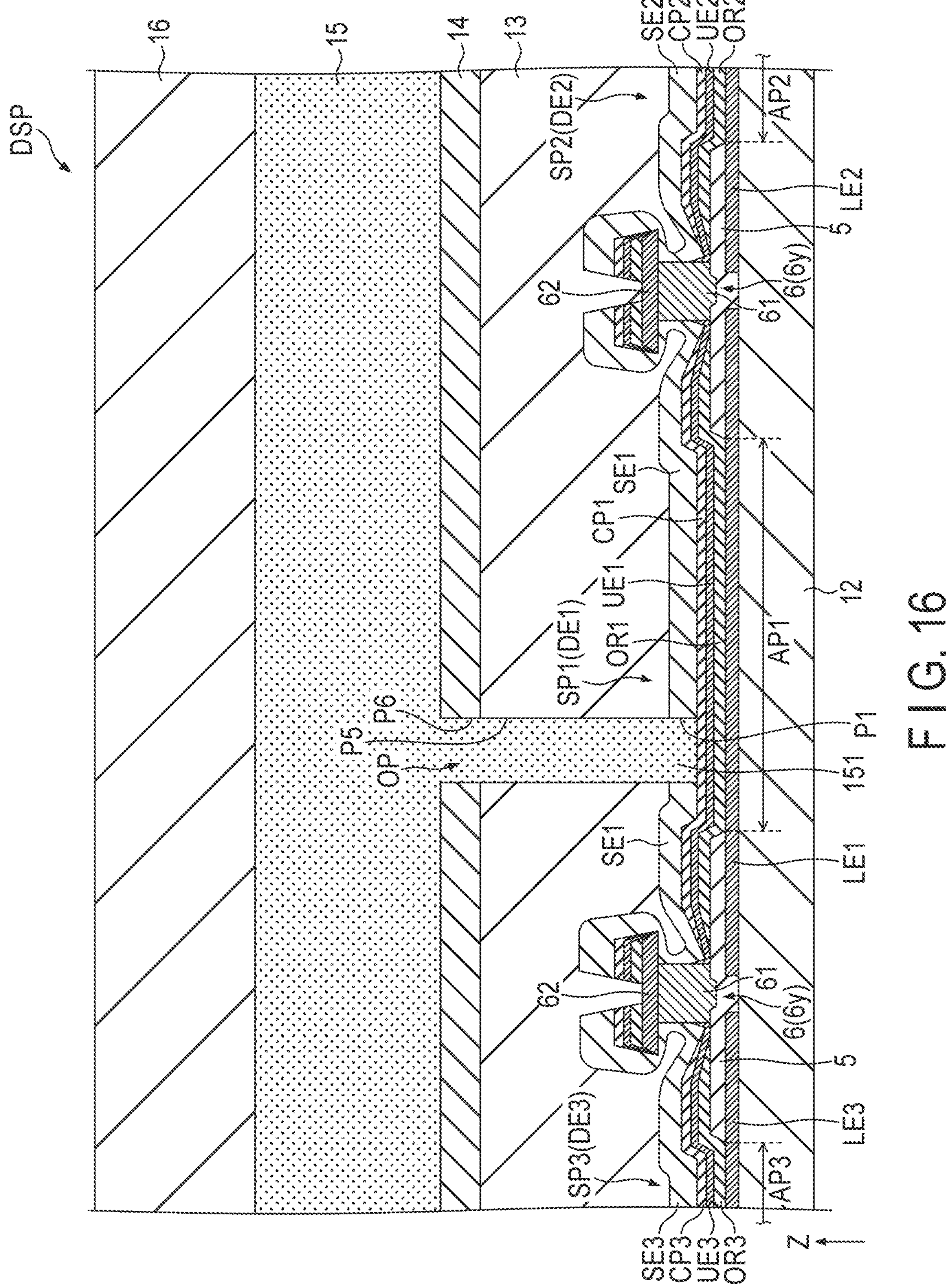
FIG. 16 is a schematic cross-sectional view showing a manufacturing step, which follows that of FIG. 15.

FIG. 14 is a flowchart showing an example of the method of manufacturing the display device DSP. FIGS. 15 and 16 are schematic cross-sectional views each showing a part of the manufacturing process of the display device DSP. In FIGS. 15 and 16, the substrate 10 and the circuit layer 11, etc., are omitted from illustration.

The processes PR1 to PR10 in this embodiment are similar to those of the first embodiment. In this embodiment, after the process PR10, a resin layer 13 which covers the sealing layers SE1, SE2 and SE3, and a sealing layer 14 are formed in sequence (process PR21).

After the process PR21, a process for inspecting a plurality of display elements DE1, DE2 and DE3 is performed (process PR22). In the inspection of the process PR22, it is checked as to whether or not any of the display elements DE1, DE2 and DE3 has a defect as in the case of the process PR11 in the first embodiment (process PR23).

When, for example, any of the display elements DE1, DE2 and DE3, which is in the bright spot state is detected in the inspection of the process PR22, it is determined that that one of the display elements DE1, DE2 and DE3 entails a defect (Yes in process PR23). If it is determined that there are no display elements DE1, DE2 and DE3 which have a defect (No in process PR23), an adhesive layer 15 is formed on the sealing layer 14 and a substrate 16 is disposed on the adhesive layer 15 (process PR25).

Here, let us assume the case where the display element DE1 has a defect. When it is determined that the display element DE1 has a defect (Yes in process PR23), a repair hole OP is formed as shown in FIG. 15 (process PR24).

In this embodiment, the repair hole OP penetrates the sealing layer 14, the resin layer 13 and the sealing layer SE1. In other words, the repair hole OP includes a through hole P5 penetrating the resin layer 13, a through hole P6 penetrating the sealing layer 14 and a through hole P1 penetrating the sealing layer SE1. The repair hole OP overlaps the cap layer CP1, the upper electrode UE1, the organic layer OR1, and the lower electrode LE1.

In the example shown in FIG. 15, the repair hole OP is formed at a position which overlaps the pixel aperture AP1. The depth of the repair hole OP is substantially equal to the total of the thicknesses of the sealing layer 14, the resin layer 13 and the sealing layer SE1 in the regions overlapping the pixel aperture AP1. The area of the repair hole OP is less than the area of the pixel aperture AP1 in the example shown in FIG. 15.

After through the process PR24, a substrate with the repair holes OP formed therein can be obtained as shown in FIG. 15. With the repair hole OP thus formed, moisture can enter though the repair holes OP. By the entering of the moisture to the display element DE1, the organic layer OR1 is deteriorated, causing the display element DE1 to become non-luminous. In this way, the bright spot state of the display element DE1 can be canceled.

After the formation of the repair hole OP, as shown in FIG. 16, an adhesive layer 15 is formed on the sealing layer 14 and a substrate 16 is disposed on the adhesive layer 15 (process PR25). Thus, the display device DSP is completed.

When the adhesive layer 15 is formed on the sealing layer 14, a portion of the adhesive layer 15 fills the repair hole OP. Therefore, the adhesive layer 15 includes a filling portion 151 located in the repair hole OP. The moisture contained in the adhesive layer 15 may enter through the repair hole OP to cause the dead spot state of the display element DE1.

In this embodiment, the repair hole OP is formed after the formation of the sealing layer 14, but the repair hole OP may be formed before the sealing layer 14 is formed.

In this embodiment, as in the case of the first embodiment, the repair hole OP may as well further include a through holes P2 formed in the cap layer CP1, or may further include a through holes P2 formed in the cap layer CP1 and a through holes P3 formed in the upper electrode UE1.

As another example, the repair hole OP may further include a through hole P2 formed in the cap layer CP1, a through hole P3 formed in the upper electrode UE1, and a through hole P4 formed in the organic layer OR1.

In this embodiment as well, advantageous effects similar to those of the first embodiment can be obtained. More specifically, in the method of manufacturing the display device DSP according to this embodiment, a repair hole OP is formed to penetrate the sealing layer SE1, SE2 and/or SE3 which covers any defective one of the display elements DE1, DE2 and DE3. With this configuration, any defective one of the display elements DE1, DE2 and DE3, which is degraded by the moisture of the organic layers OR1, OR2 and OR3 can be changed from the bright spot state to the dead spot state in which the light is not emitted.

Thus, the deterioration of the display quality of the display device DSP due to the defective one of the display elements DE1, DE2 and DE3 can be suppressed. As a result, according to this embodiment, it is possible to provide a method of manufacturing a display device DSP with an improved display quality.

In each of the embodiments provided above, the case where one repair hole OP is formed in the sealing layer SE1, SE2 and/or SE3 which covers the defective one of the display elements DE1, DE2 and DE3 is described. But there may be as well a plurality of repair holes formed the sealing layers SE1, SE2 and/or SE3 covering the defective one of the display elements DE1, DE2 and DE3. In this embodiment presented above, the repair hole OP is formed by a laser beam 70, but the repair hole OP may as well be formed by mechanical means.

All of the display devices and manufacturing methods therefor that can be implemented by a person of ordinary skill in the art through arbitrary design changes based on the display devices and the manufacturing methods described above as the embodiments and the modified examples of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each of the above embodiments and modified examples and are self-explanatory from the descriptions of the specification or can be arbitrarily conceived by a person of ordinary skill in the art are considered to be naturally brought about by the present invention as a matter of course.

What is claimed is:

1. A method of manufacturing a display device, comprising:

forming a plurality of display elements each including a lower electrode, an organic layer which covers the lower electrode and an upper electrode which covers the organic layer;

forming a first sealing layer which seals the plurality of display elements, individually;

inspecting the plurality of display elements to determine whether any of the plurality of display elements entails a defect; and forming, when in the inspection, it is confirmed that there is a defective one of the display elements, a repair hole that penetrates the first sealing layer that seals the defective one of the display elements.

2. The manufacturing method of claim 1, wherein the forming the plurality of display elements, includes:

forming the lower electrode;

forming the organic layer which covers the lower electrode; and forming the upper electrode which covers the organic layer.

3. The manufacturing method of claim 2, further comprising:

forming a rib comprising pixel apertures which overlap the lower electrodes, after the forming of the lower electrode; and forming a partition disposed on the rib between each pair of pixel apertures adjacent to each other, after the forming of the rib.

4. The manufacturing method of claim 3, wherein the repair hole overlap a respective one of the pixel apertures, and an area of the repair hole is smaller than an area of the respective one of the pixel apertures.

5. The manufacturing method of claim 3, wherein the repair hole overlaps a respective one of the pixel apertures.

6. The manufacturing method of claim 1, further comprising:

forming a resin layer which covers the first sealing layer and fills the repair hole, after the forming of the repair hole.

7. The manufacturing method of claim 6, wherein the resin layer includes a first filling portion located in the repair hole.

8. The manufacturing method of claim 1, wherein the repair hole further penetrates the upper electrode.

9. The manufacturing method of claim 8, wherein the repair hole further penetrates the organic layer.

10. The manufacturing method of claim 1, further comprising:

forming a resin layer which covers the first sealing layer, after the forming the first sealing layer, wherein the repair hole penetrates the resin layer and the first sealing layer.

11. The manufacturing method of claim 1, further comprising:

forming a second sealing layer which covers the resin layer after the forming of the resin layer, wherein the repair hole penetrates the second sealing layer, the resin layer and the first sealing layer.

12. The manufacturing method of claim 11, further comprising:

forming an adhesive layer which covers the second sealing layer and fills the repair hole, after the forming of the repair hole.

13. The manufacturing method of claim 12, wherein the adhesive layer includes a second filling portion located in the repair hole.

14. The manufacturing method of claim 1, wherein the forming of the repair hole comprises irradiating a laser beam toward the defective one of the display elements.

15. The manufacturing method of claim 1, wherein the repair hole does not penetrate the lower electrode.

16. The manufacturing method of claim 1, wherein the plurality of display elements each further comprises a cap layer which covers the upper electrode.

17. The manufacturing method of claim 16, wherein the repair hole further penetrates the cap layer.

18. The manufacturing method of claim 1, wherein the inspecting comprises determining that there is a display element having a defect when a display element in a bright spot state is detected.

19. The manufacturing method of claim 1, further comprising:

allowing moisture to enter the display element from the repair hole after the forming of the repair hole.

20. The manufacturing method of claim 1, wherein the forming of the repair holes comprises forming a plurality of repair holes each identical to the repair hole in the defective one of the display elements.

* * * * *